US008945800B2

(12) United States Patent
Chiou et al.

(10) Patent No.: US 8,945,800 B2
(45) Date of Patent: Feb. 3, 2015

(54) METHOD OF PREPARING A PATTERN, METHOD OF FORMING A MASK SET, DEVICE MANUFACTURING METHOD AND COMPUTER PROGRAM

(71) Applicant: ASML Netherlands B.V., Veldhoven (NL)

(72) Inventors: Tsann-Bim Chiou, Hsinchu (TW); Mircea Dusa, Wezembeek-Oppem (BE); Alek Chi-Heng Chen, New Taipei (TW)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/965,103

(22) Filed: Aug. 12, 2013

(65) Prior Publication Data

US 2014/0051016 A1   Feb. 20, 2014

Related U.S. Application Data

(60) Provisional application No. 61/691,231, filed on Aug. 20, 2012.

(51) Int. Cl.
| G03F 1/22 | (2012.01) |
| G03F 1/68 | (2012.01) |
| G03F 7/26 | (2006.01) |
| G06F 17/50 | (2006.01) |
| G03F 7/20 | (2006.01) |

(52) U.S. Cl.
CPC .............. *G03F 1/22* (2013.01); *G06F 17/5068* (2013.01); *G03F 1/68* (2013.01); *G03F 7/70433* (2013.01); *G03F 7/70466* (2013.01)
USPC ................... 430/5; 430/22; 430/30; 430/312; 430/313; 430/394; 716/50; 716/52

(58) Field of Classification Search
CPC ......... G03F 1/22; G03F 1/68; G03F 7/70433; G03F 7/70466; G06F 17/5036; G06F 17/5068; G06F 17/5081
USPC ............ 430/5, 22, 30, 312, 313, 394; 716/50, 716/52
See application file for complete search history.

(56) References Cited

U.S. PATENT DOCUMENTS

| 6,952,253 B2 | 10/2005 | Lof et al. |
| 7,701,550 B2 | 4/2010 | Kemper et al. |
| 2004/0207824 A1 | 10/2004 | Lof et al. |
| 2006/0038968 A1 | 2/2006 | Kemper et al. |
| 2007/0212649 A1 | 9/2007 | Lalbahadoersing et al. |
| 2009/0199137 A1 | 8/2009 | Huckabay et al. |
| 2011/0271238 A1 | 11/2011 | Mansfield et al. |
| 2012/0110521 A1 | 5/2012 | Agarwal et al. |
| 2012/0135600 A1 | 5/2012 | Lin et al. |
| 2012/0196230 A1 | 8/2012 | Cho et al. |
| 2012/0319287 A1 | 12/2012 | Huang et al. |
| 2013/0007674 A1 | 1/2013 | Abou Ghaida et al. |

FOREIGN PATENT DOCUMENTS

| TW | 200410043 A | 6/2004 |
| TW | 200943429 | 10/2009 |
| TW | 201011475 | 3/2010 |
| WO | 99/49504 | 9/1999 |

OTHER PUBLICATIONS

International Search Report mailed Dec. 20, 2013 in corresponding International Patent Application No. PCT/EP2013/066338.
Minoo Mirsaeedi, "EDA Solutions for Double Patterning Lithography," A thesis presented to the University of Waterloo, Waterloo, Ontario, Canada, pp. i-135 (2012).
David Z. Pan et al., "CAD for Double Patterning Lithography," International Conference on IC Design and Technology, pp. 122-125 (2010).

*Primary Examiner* — Christopher Young
(74) *Attorney, Agent, or Firm* — Pillsbury Winthrop Shaw Pittman LLP

(57) ABSTRACT

In a multiple patterning techniques, where two or more exposures are used to form a single layer of a device, the splitting of features in a single layer between the multiple exposures is carried out additionally with reference to features of another associated layer and the splitting of that layer into two or more sets of features for separate exposure. The multiple exposure process can be a process involving repeated litho-etch steps desirably, the alignment scheme utilized during exposure of the split layers is optimized with reference to the splitting approach.

19 Claims, 10 Drawing Sheets

Fig. 9
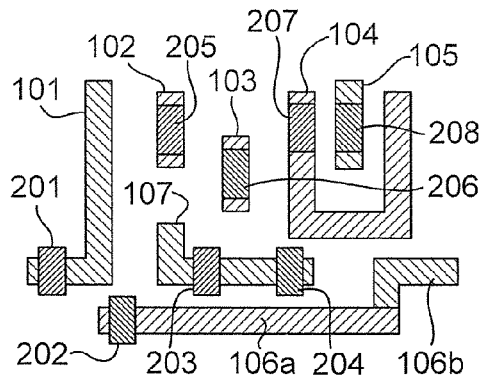
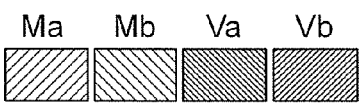
Fig. 10
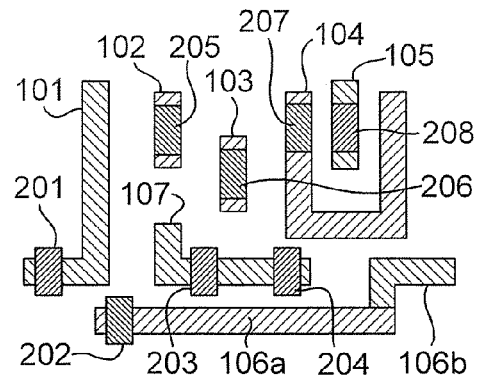
Fig. 11
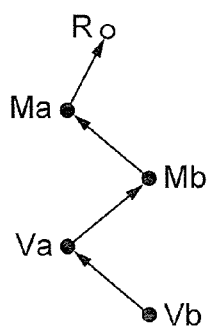
Fig. 12
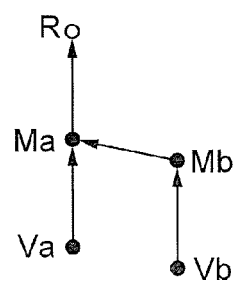
Fig. 13
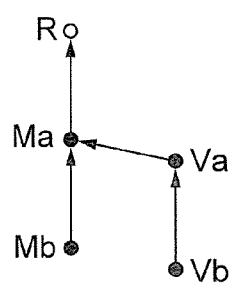
Fig. 14
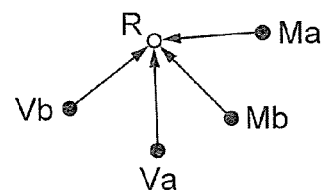

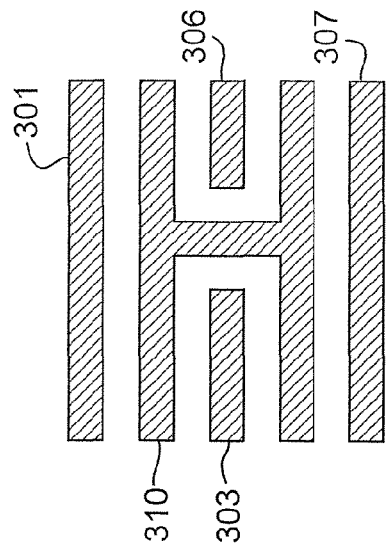
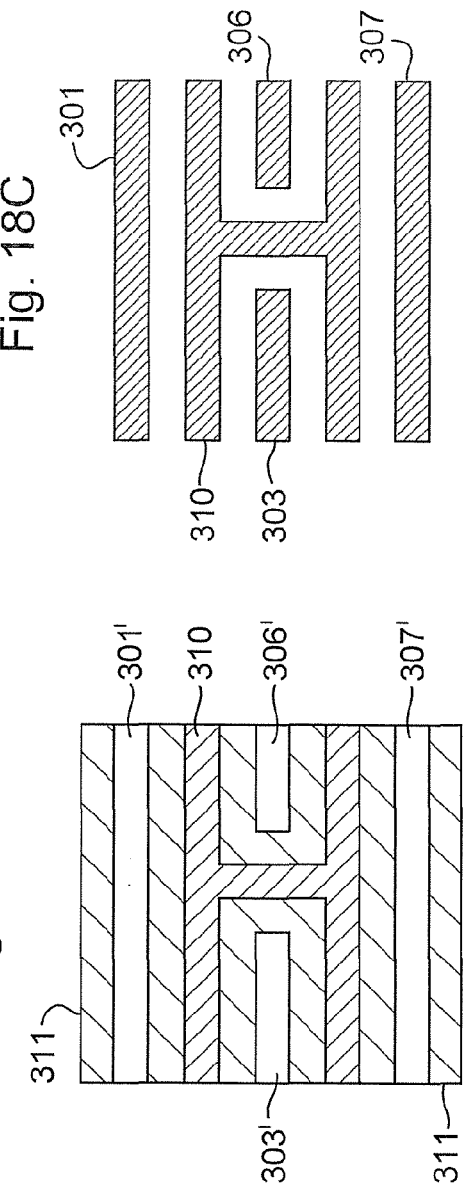
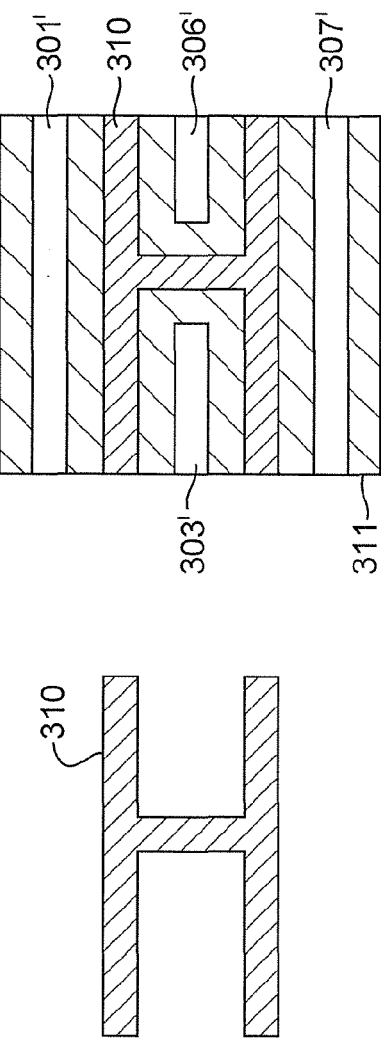
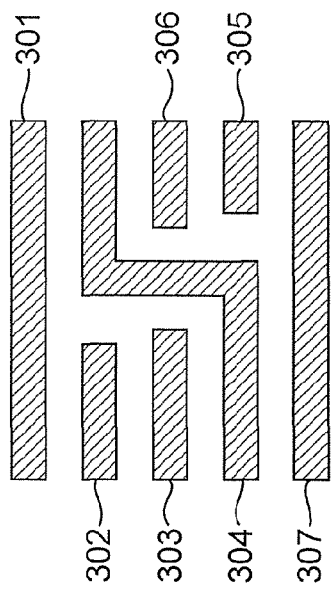
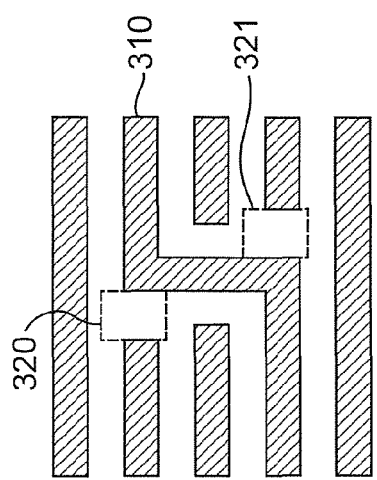

METHOD OF PREPARING A PATTERN, METHOD OF FORMING A MASK SET, DEVICE MANUFACTURING METHOD AND COMPUTER PROGRAM

CROSS REFERENCE TO RELATED APPLICATIONS

This application claims the benefit under 35 USC 119(e) of prior U.S. Provisional Patent Application No. 61/691,231, filed Aug. 20, 2012, the disclosure of which is hereby incorporated by reference in its entirety.

FIELD

The present invention relates to a method of preparing a pattern for a device manufacturing method using such a lithographic apparatus, in particular a method in which features of a single layer of the device are patterned in multiple exposure steps, a method of forming a mask set, a device manufacturing method and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In lithography processes, multiple layers must be patterned accurately relative to one another. Positioning errors between device layers, known as overlay errors, must be kept within acceptable limits, which tend to become stricter as the sizes of features to be formed reduce. Furthermore, to reduce the size of features that can be formed using lithography, so-called multiple patterning techniques have been developed. Multiple patterning techniques, such as litho-etch-litho-etch and spacer-based processes, use multiple lithographic patterning steps to define the features of a single layer of a device. When such techniques are used, overlay errors between the multiple patterning steps that are used to form a single layer must also be minimized, often more strictly than overlay errors between separate device layers. This is because overlay errors between the multiple patterning steps that go to form a single layer also cause CD uniformity or line edge roughness issues, in addition to the fact that overlay requirements are inevitably stricter because smaller features are being formed.

A number of techniques to reduce overlay errors are known. For example, efforts may be made to improve the positioning performance and metrology performance of the lithographic apparatus. A calibration system may be used to ensure that a group of lithographic apparatus operate to a common performance level. Critical layers of a device may be manufactured using a dedicated-chuck process in which a specific substrate table of a specific apparatus is always used for patterning of the critical layers of all substrates. However, none of these techniques provides a sufficient improvement in overlay performance. Also, all of these techniques have drawbacks, in particular they reduce throughput and thereby increase the cost of ownership of the apparatus.

Therefore, it is desirable to provide a technique for reducing overlay errors within multiple patterning techniques, in particular where features of a single layer of the device are patterned in multiple exposure steps and correlated to features of other layers of the same device.

According to an aspect of the invention, there is provided a method of preparing an exposure pattern for a device manufacturing method using a lithographic apparatus, the method comprising: receiving first data representing a first pattern to be used to define a first layer of a device using the lithographic apparatus; receiving second data representing a second pattern to be used to define a second layer of a device using the lithographic apparatus, the second layer being associated with the first layer; first assigning features of the first pattern to a first set and a second set according to a first rule; second assigning features of the second pattern to a third set and a fourth set according to a second rule, wherein the second rule takes account of the results of the first assigning.

According to an aspect of the invention, there is provided a method of forming a mask set, the method comprising: preparing an exposure pattern according to the method as described above; forming a set of masks, the set of masks including a plurality of masks, each mask embodying a respective one of the sets of features.

According to an aspect of the invention, there is provided a device manufacturing method using a lithographic apparatus, the method comprising the steps of: forming a set of masks as described above; projecting a beam patterned by one of the plurality of masks onto a substrate to expose it to the respective pattern; processing the substrate to fix the pattern exposed thereon; and repeating the projecting and processing steps using each other of the plurality of masks.

According to an aspect of the invention, there is provided a computer program for programming an exposure pattern for a device manufacturing method using a lithographic apparatus, the program comprising code that, when executed by a computer system, instructs the computer system to: receive first data representing a first pattern to be used to define a first layer of a device using the lithographic apparatus; receive second data representing a second pattern to be used to define a second layer of a device using the lithographic apparatus, the second layer being associated with the first layer; first assign features of the first pattern to a first set and a second set according to a first rule; second assign features of the second pattern to a third set and a fourth set according to a second rule, wherein the second rule takes account of the results of the first assigning.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9 depicts two associated layers of a device pattern indicating how each layer is split between two exposures;

FIG. 10 depicts two associated layers of a device pattern indicating how the features of each layer are split between two patterning layers according to an embodiment of the invention;

FIG. 11 depicts a conventional alignment scheme;

FIG. 12 depicts an alignment scheme according to an embodiment of the invention;

FIG. 13 depicts an alignment scheme according to an embodiment of the invention;

FIG. 14 depicts an alignment scheme according to an embodiment of the invention;

FIGS. 18A to E depict steps in a method of forming the device pattern of FIG. 17;

DETAILED DESCRIPTION

Figure 1:
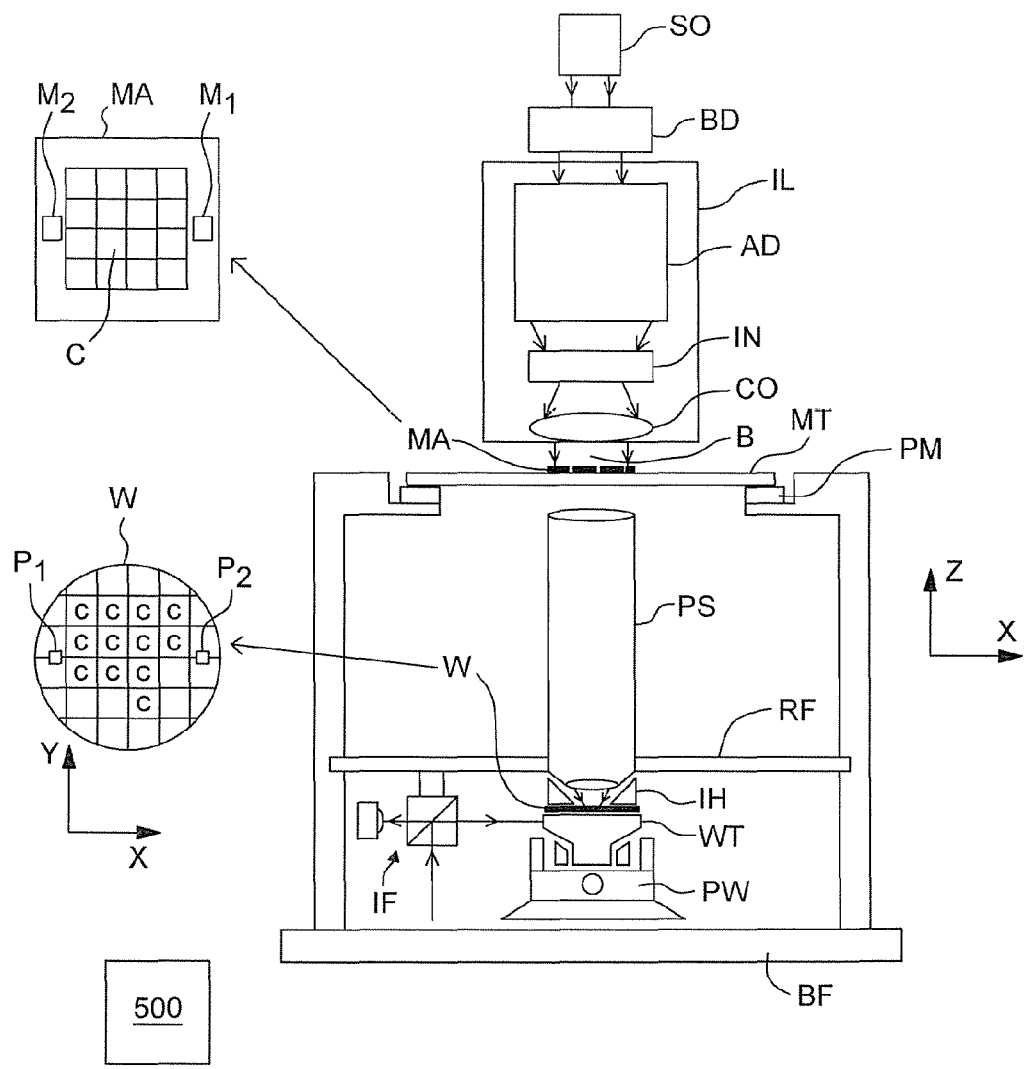
FIG. 1 depicts a lithographic apparatus according to an embodiment of the invention.

FIG. 1 schematically depicts a lithographic apparatus according to one embodiment of the invention. The apparatus comprises:
   an illumination system (illuminator) IL configured to condition a radiation beam B (e.g. UV radiation, DUV radiation or EUV radiation);
   a support structure (e.g. a mask table) MT constructed to support a patterning device (e.g. a mask) Ma and connected to a first positioner PM configured to accurately position the patterning device in accordance with certain parameters;
   a substrate table (e.g. a wafer table) WT constructed to hold a substrate (e.g. a resist-coated wafer) W and connected to a second positioner PW configured to accurately position the substrate in accordance with certain parameters; and
   a projection system (e.g. a refractive projection lens system) PS configured to project a pattern imparted to the radiation beam B by patterning device Ma onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device Ma, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device Ma with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device Ma and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatuses, a fluid, in particular a liquid, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin-film, of liquid on the substrate.

Four different types of localized liquid supply systems are illustrated in FIGS. 2 to 5. Any of the liquid supply devices of FIGS. 2 to 5 may be used in an unconfined system; however, sealing features are not present, are not activated, are not as efficient as normal or are otherwise ineffective to seal liquid to only the localized area.

Figure 2:
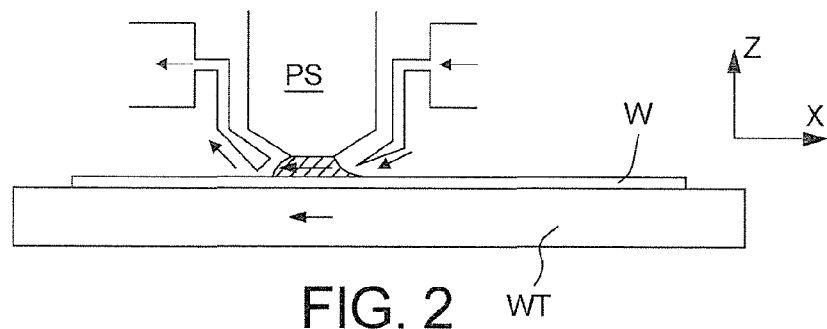
FIGS. 2 and 3 depict a liquid supply system for use in a lithographic projection apparatus.
Figure 3:
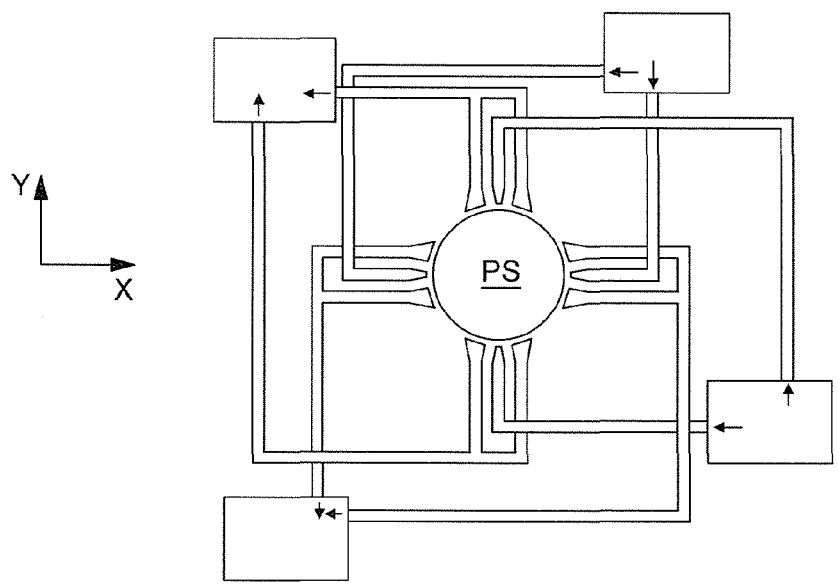

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
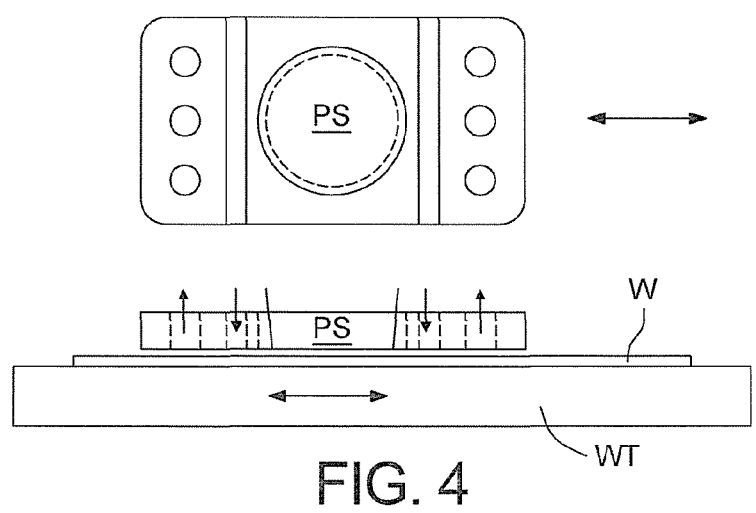
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin-film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in to inlets and out of outlets.

Figure 5:
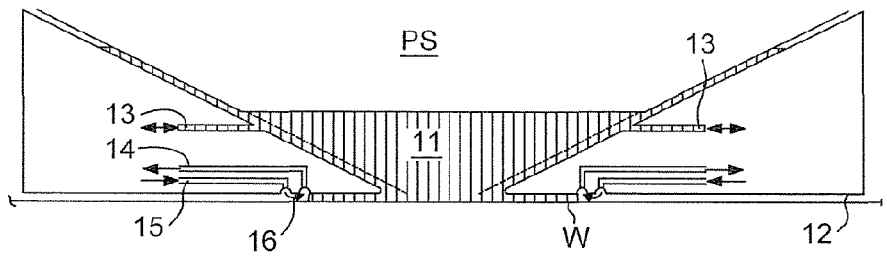
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane, though there may be some relative movement in the Z direction (in the direction of the optical axis). A seal is formed between the liquid confinement member and the surface of the substrate. In an embodiment, a seal is formed between the liquid confinement member and the surface of the substrate and may be a contactless seal such as a gas seal. Such a system is disclosed in United States patent application publication no. US 2004-0207824.

The fluid handling structure 12 includes a liquid confinement member and at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air, synthetic air, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
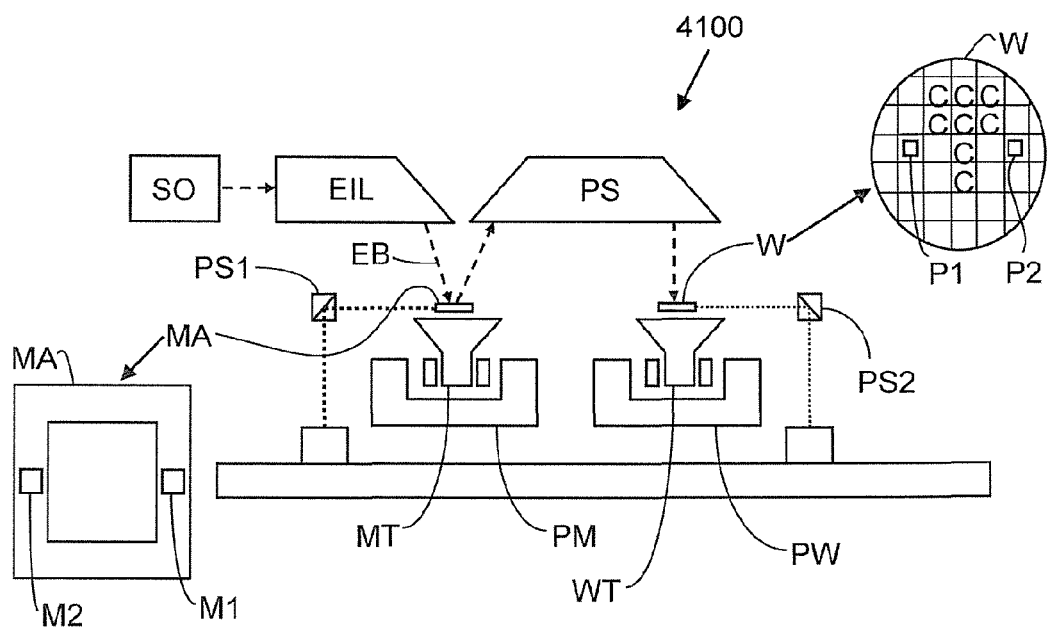
FIG. 6 depicts a lithographic apparatus according to an embodiment of the invention.

FIG. 6 schematically depicts an EUV lithographic apparatus 4100 including a source collector apparatus SO. The apparatus comprises:

an illumination system (illuminator) EIL configured to condition a radiation beam B (e.g. EUV radiation);

a support structure (e.g. a mask table) MT constructed to support a patterning device (e.g. a mask or a reticle) Ma and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 6, the EUV illuminator EIL receives an extreme ultraviolet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 6, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) Ma, which is held on the support structure (e.g., mask table) MT, and is patterned by the patterning device. After being reflected from the patterning device (e.g. mask) Ma, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) Ma with respect to the path of the radiation beam EB. Patterning device (e.g. mask) Ma and substrate W may be aligned using mask alignment marks M1, M2 and substrate alignment marks P1, P2.

The depicted apparatus can be used in the same modes as the apparatus of FIG. 1.

Figure 7:
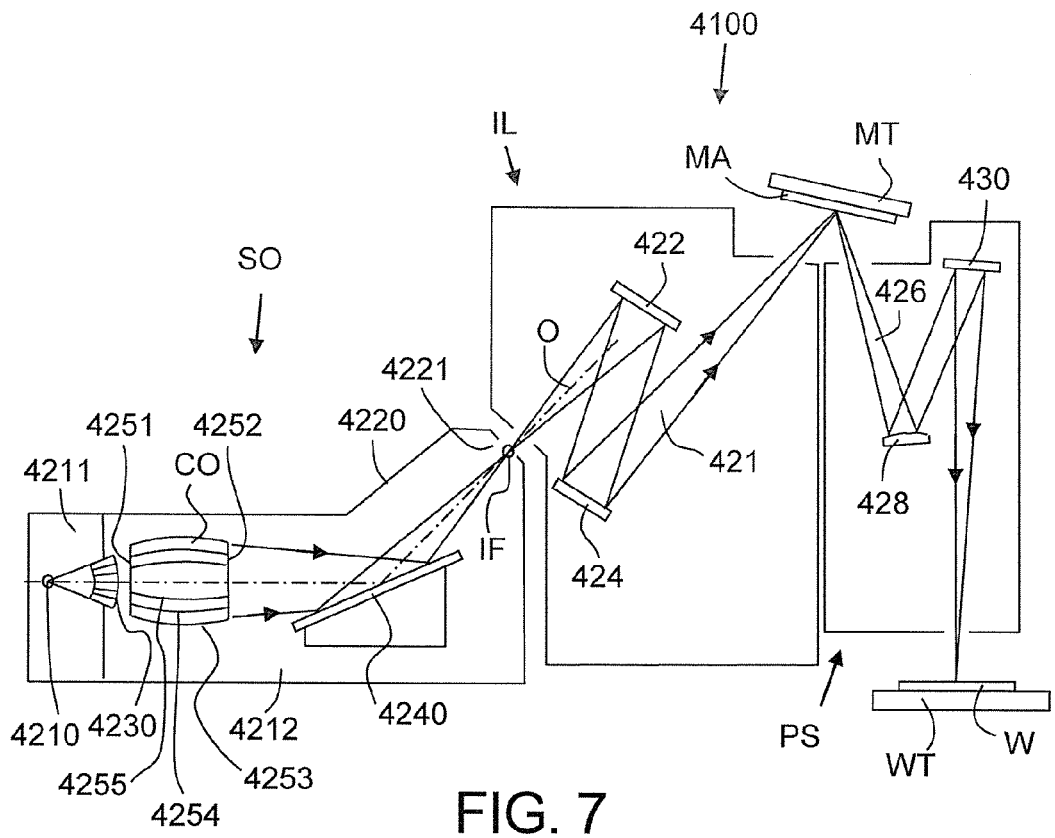
FIG. 7 is a more detailed view of the apparatus of FIG. 6.

FIG. 7 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device Ma, as well as a desired uniformity of radiation intensity at the patterning device Ma. Upon reflection of the beam of radiation 421 at the patterning device Ma, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 7.

Collector optic CO, as illustrated in FIG. 7, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 8:
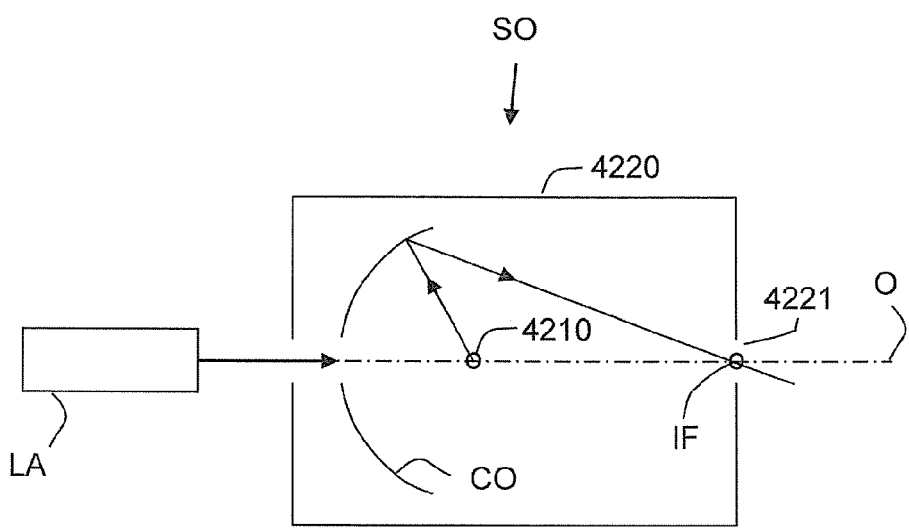
FIG. 8 is a more detailed view of the source collector apparatus of the apparatus of FIGS. 6 and 7.

Alternatively, the source collector apparatus SO may be part of an LPP radiation system as shown in FIG. 8. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220.

In the field of lithography, there is a continuous pressure to reduce the minimum size of feature that can be imaged. For a given wavelength of exposure radiation, basic physics sets a minimum limit on the feature size that can be imaged in a single exposure. Therefore, various techniques involving multiple, commonly two, exposure steps to create a single device layer have been developed.

One multiple-pattern technique is a litho-etch-litho-etch (LELE) process. In such a process, an array of features that are too small and too closely spaced to image in a single exposure step are divided into two sets so that adjacent features are in different sets. Each set of features considered separately as a pitch that can be imaged in a single exposure. The first set of features is exposed, of necessity resulting in features that are larger than ultimately desired. The first set of features are then etched back to the desired size. They are then protected. The second set of features is exposed in between the first set of features. Again these will normally be oversized and are etched back to the desired size. Although two lithography (exposure) and etch steps is common, this technique can be extended to use three, four or more litho-etch steps if required to ensure that each step can be comfortably imaged.

In spacer-based techniques, an initial feature is formed on the substrate then a spacer layer grown around the initial features and used as a mask to control formation of other features. As with litho-etch multiple patterning techniques, the formation of spacers can be repeated to further reduce the feature size and/or pitch. A second lithography step is sometimes performed to define additional guide features on which spacer layers are provided. Also, a trim step can be required to finally define the feature sizes, requiring one or more further exposure steps.

As is well known, a semiconductor device is formed by creating multiple device layers. Although the feature sizes in different layers and their tolerances vary, it is common that two critical layers, that is layers having small feature sizes and tight tolerances, are adjacent each other and must be accurately positioned relative to one another, i.e. have low tolerances for overlay error. Such associated layers can include a metal layer that makes connections within a layer of components of the device and a via layer that makes connections between device layers. It is important for the proper functioning of the device that the vias are accurately positioned relative to conductive tracks of the metal layer to which they must make contact. Misalignments can alter the electrical characteristics of the devices, in some cases sufficiently to result in device failure. Similar issues arise in the formation of other layers and layer pairs, for example local interconnect layers, contact layers and the formation of drains and sources of transistors. This issue arises in all types of device including those with a high degree of regularity such as memory cells and arrays as well as less regular device types such as processors and logic cells.

If a device layer comprising a plurality of features is to be imaged in multiple imaging steps, conventionally a geometric rule is used to divide the features into two or more sets corresponding to the number of exposures to be performed. This can best be explained by reference to an example illustrated in FIG. 9 of the accompanying drawings. This figure represents a metal interconnect layer comprising features 101 to 107 which are conductive tracks, e.g. formed of metal, that connect between components of the device. Also shown is a via layer comprising features 201 to 208 which make connections between the metal interconnect conductors and features in other layers of the device. For the resulting circuit to form correctly, consistent electrical connections must be made between the metal interconnects and the vias.

To form a pattern such as that shown in FIG. 9 using a double patterning technique, the different features in each layer must be assigned to the different exposures. In this example we consider two exposures Ma, Mb to define the metal interconnects and two exposures Va, Vb to define the vias. A geometric rule operating on each layer is used to allocate features to each exposure as indicated by the different orientations of hatching in FIG. 9. The geometric rule can, for example, specify that adjacent features are assigned to different exposures or that features closer together than a predetermined minimum distance or separation are allocated to different exposures.

In the example of FIG. 9, metal interconnect features 102, 103, 104 are assigned to first metal exposure Ma. Metal interconnect features 101, 107 and 105 are allocated to second metal exposure Ma. Metal interconnect 106 is split into two parts 106a, 106b which are assigned respectively to first and second metal exposures, Ma, Mb. This necessitates a stitching process at the join. In the via layer, vias 201, 203, 205, 207 are assigned to the first via exposure Va, whilst vias 202, 204, 206 and 208 are assigned to the second via exposure Vb.

According to the assignment of features of the conventional approach shown in FIG. 9, the performance of the ultimately created device is dependent on six different overlay errors: the overlay error between Ma and Mb, the overlay error between Va and Vb, the overlay error between Ma and Va, the overlay error between Ma and Vb, the overlay error between Mb and Va and the overlay error between Mb and Vb. In particular, this is because vias formed in both exposures Va, Vb must make contact to metal interconnects formed in each of exposures Ma, Mb. The specific example shows via 203 formed in step Vb and via 204 formed in step Va both contacting interconnect 107.

According to the present invention, in a process for splitting features of the single device layer to be defined in multiple exposure steps, account is taken of features in an associated device layer. In particular, the assignment of features in a first device layer to multiple exposure steps takes account of the assignment to multiple exposure of features in a second device layer that is associated with the first device layer. It will be appreciated that a "feature" of a layer that is treated by the present invention need not correspond directly to a device feature manifested in the end product. A device feature can be made up from more than one feature of one or more exposures. A single feature formed in one exposure can become multiple device features. A feature of an exposure can be used to alter the characteristics or shape of a device feature, e.g. by defining a part of a hard mask or etch mask.

In an embodiment of the invention, a first set of features of a first device layer are assigned to a first exposure and a second set of features of the first device layer are assigned to a second exposure. A third set of features of the second device layer are assigned to a third exposure and a fourth set of features of the second device layer are assigned to a fourth exposure. The assignment of features is arranged such that all features (desirably all features) of the second device layer that make contact with features of the first set of the first device layer are contained in the third set and all features (desirably all features) of the second device layer that make contact with features of the second set of the first device layer are contained in the fourth set. It should be noted that the exposure need not be carried out in the order implied by the above names.

The effect of the present invention can be seen by comparing FIG. 10, which indicates exposure assignments effected according to an embodiment of the invention, with FIG. 9.

It can be seen that, for example, vias 203 and 204 are now assigned to the same exposure, the second exposure, as they both contact interconnect 107 which is formed in the second metal exposure Mb. In the conventional process illustrated in FIG. 9, these vias are assigned to different exposures. It can be seen in FIG. 10 that in this embodiment of the invention, all of the vias that contact interconnects formed in first metal exposure Ma are formed in first via exposure Va and all vias that connect to interconnects formed in second metal exposure Mb are formed in second via exposure Vb. As a result, the performance of the device is dependent on fewer overlay errors. Performance of the device is not longer dependent of overlay errors between first metal exposure Ma and second via exposure Vb nor the overlay error between second metal exposure Mb and first via exposure Va. As well as the direct improvement in yield (and therefore reduction in cost of ownership) afforded by the reduced dependence of overlay errors, the present invention can improve the performance of other overlay reduction techniques since performance must be optimized for fewer relationships between exposures or layers. Furthermore, the present invention allows the use of optimized alignment schemes to further reduce overlay.

Of course the rigid application of the above rules might in some circumstances result in features of the second layer that are too close together to be properly imaged being assigned on the same exposure step. In such a case it may be possible to apply more aggressive optical proximity correction (OPC) to the two features of the second layer. Alternatively, it is possible to revisit the assignment of features in the first layer. In an embodiment it is also possible to introduce a split in a feature of the first layer to enable a more convenient assignment.

Embodiments of the present invention can use any suitable alignment scheme to control relative positioning of the multiple exposures in each layer and between layers. However, as discussed further below. Further improvements can be achieved using optimized alignment schemes.

In a conventional alignment scheme as illustrated in FIG. 11, first metal layer Ma is aligned to a reference R, second metal exposure Mb is aligned to first metal exposure Ma, first via exposure Va is aligned to second metal exposure Mb and second via exposure Vb is aligned to first via exposure Va. If the inter-exposure overlay performance is E, use of a series alignment technique such as illustrated in FIG. 11 with a conventional pattern splitting process using geometric rules within each layer only, there will result in an overlay performance between the second via exposure and the first metal exposure of $\sqrt{3}E$. The overlay performance can be measured by any suitable technique. Various methods using statistical treatment of specified measurement schemes are known in the art. Using the pattern splitting approach of the present invention, the largest, i.e. worst, overlay performance is the overlay performance between the first via exposure and the first metal exposure and the overlay performance between the second via exposure and the second metal exposure. These overlay performances are $\sqrt{2}E$ so that with the invention the largest average overlay error is reduced by about 18%.

For example, in the alignment scheme shown in FIG. 12, which is referred to as direct alignment, the first metal exposure Ma is aligned to the reference R, the second metal exposure Mb is aligned to the first metal exposure Ma, the first via exposure is aligned to the first metal exposure Ma and the second via exposure Vb is aligned to the second metal exposure Mb. With this approach, the overlay performance is E. Therefore there is a 30% improvement over the approach of FIG. 11.

A parallel alignment scheme shown in FIG. 13 is less advantageous for the present invention as the overlay performance becomes that between the second via layer Vb and the second metal layer Mb which is √3E. A target type alignment scheme shown in FIG. 14 in which all exposures are directly aligned to the reference R results in an overlay performance of √2E, which again provides an 18% improvement over the conventional method. An alignment process according to an embodiment of the invention can be carried out using conventional alignment devices and markers. The alignment markers are formed in the respective exposure steps and uncovered, if necessary, for measurements.

Figure 15:
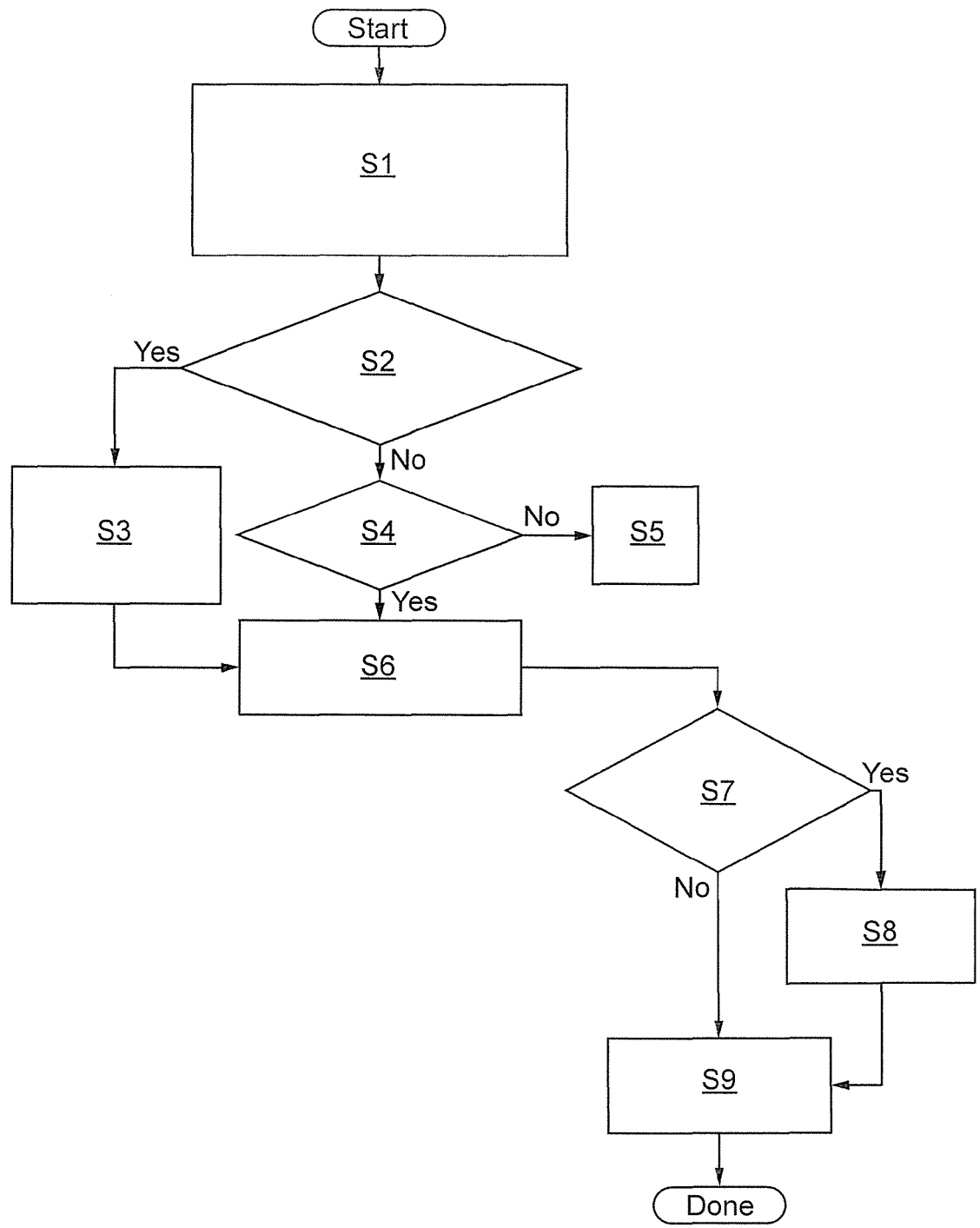
FIG. 15 depicts a pattern splitting method according to an embodiment of the invention.

FIG. 15 depicts in more detail a pattern-splitting method according to an embodiment of the invention. In an embodiment of the invention the method of FIG. 15 is computer implemented. An embodiment of the present invention comprises computer code to effect the method of FIG. 15 when executed on a suitable computer. In a first step S1 features in a first layer, e.g. a via layer, are considered to determine any pairs of features that must be split between two exposures. The criteria applied to determine whether pairs must be split can be based on edge-to-edge and corner-to-corner proximity rules. Center-to-center distances and pitch can also be used. Minimum separations can be determined by reference to the available k1 value of the lithographic process to be used or by lithographic simulation. A record of pairs that must be split can be made, e.g. by setting a flag in a database.

In step S2, features of the associated layer, e.g. an underlying metal interconnect layer are considered to detect if any feature of the associated second layer contacts both of a pair of features in the first layer that are required to be split. If yes, in step S3 a record is made, e.g. by setting a flag in a database, that the feature in the second associated layer that contacts two features in the first layer that must be split is to be divided into two features which are then stitched together. If two features in the first layer that must be split do not contact the same feature in the second associated layer, features contacted by each of the two features that must be split are similarly marked as requiring to be split, e.g. by setting a flag in a database, S4. Otherwise, it is determined S5 that no additional considerations need to be taken in to account in splitting the second associated layer. Steps S2, S3, S4 and S5 are repeated for each of the feature pairs in the first layer that are required to be split.

Once all feature pairs in the first layer that have to be split have been considered, the second associated layer is split S6 using a conventional pattern splitting tool but taking account of the constraints as to which features must be split. When this is done a check, S7, is performed to determine if the two parts of a divided feature or two features contacting a feature pair marked for splitting cannot be separated into different exposures. If the result of the check S7 is yes, S8, then those parts or features are marked. After the check and marking steps S7 and S8, the first layer pattern is split into two parts with any parts marked in step S8 highlighted and considered subsequently for further treatment. The output of the splitting process is two pairs of device patterns, each pair corresponding to a single device layer in a format, e.g. GDSII, usable for the manufacture of masks.

Figure 16:
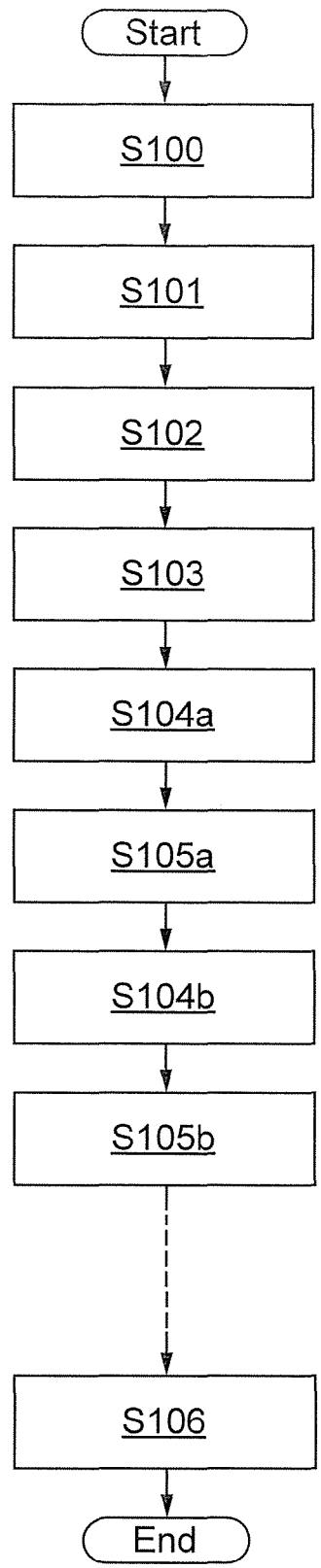
FIG. 16 depicts a device manufacturing method according to an embodiment of the invention.

FIG. 16 illustrates how the pattern splitting method of an embodiment of the invention sits within the complete device design and manufacturing process. In step S100, the device to be manufactured is designed. In step S101 the design of the device is converted to data describing each layer to be formed in the manufacturing process and associated layers that should be considered together are identified. In step S102 any layers that must be split into two exposures are identified and the splitting process as described above performed, taking account of features in associated layers. In step 103 optical proximity correction (OPC) is applied to the exposure patterns. The degree of OPC applied can be altered depending on the results of the pattern splitting step. In particular, additional corrections can be applied to features which have been highlighted as not possible to split. Once the OPC has been applied, the required masks are manufactured and supplied to the fab. To manufacture the device, a series of exposure steps 104a, 104b . . . and develop/process steps 105a, 105b . . . are carried out as required. In step S106 the devices are finished and separated, e.g. by dicing, for packaging.

An embodiment of the invention using a spacer-based multiple patterning approach is now described with reference to FIGS. 17 to 19.

Figure 17:
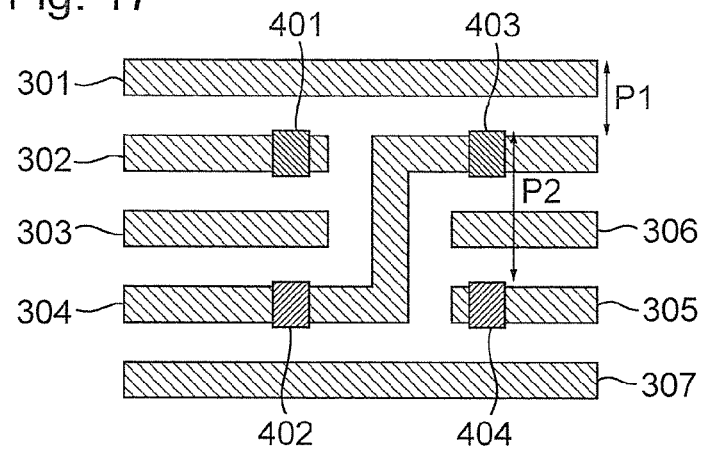
FIG. 17 depicts a device pattern to be formed.

The pattern to be formed is shown in FIG. 17. It comprises metal interconnects 301, 302, 303, 304, 305 and 306 which mostly run parallel to one another with a pitch P1. Pitch P1 is sub-resolution for the intended process so that the interconnects are to be formed with a spacer-based process. Interconnect 304 has a central vertical section so that it has a dog leg shape and separates interconnects 302 and 303 from interconnects 305 and 306. It should be noted that in describing this pattern, the terms horizontal and vertical do not necessary denote specific orientations in space but merely two orthogonal directions within the plane of the pattern. The pattern of FIG. 17 also includes vias 401, 402, 403 and 404 which connect to respectively metal interconnects 302, 304, 304 and 30. The vertical pitch P2 of the vias is also sub-resolution so that the vias also need to be formed using a multiple exposure technique.

FIGS. 18A to E depicts steps of the method to form the pattern of FIG. 17. In the first step, depicted in FIG. 18A, an initial sacrificial feature 310 is formed. The term sacrificial indicates that the feature does not remain in the device pattern as finally formed exactly as initially formed. In this case it will be seen that parts of the sacrificial feature 310 remain to form parts of the interconnect layer. Sacrificial feature 310 has the shape of an H turned on its side, or a I with elongate top and bottom pieces. Next, as depicted in FIG. 18B, a spacer layer 311 is formed around sacrificial feature 310 and other features not shown in the drawings. The thickness of spacer layer 311 is carefully controlled so that it leaves spaces 301' 303' 306' and 307' corresponding to interconnects 301, 303, 306 and 307. These interconnects are then formed in those spaces and the spacer layer 311 removed to reach the position shown in FIG. 18C.

As there depicted, interconnects 301, 303, 306 and 307 are in their final form but sacrificial feature 310 requires trimming to form interconnects 302, 304 and 305. Trimming of sacrificial feature 310 is performed by depositing a trim mask having two apertures 320, 321 positioned so that when an etch is performed through the trim mask, sacrificial feature 310 is separated into interconnects 302, 304 and 305. The spacing of trim mask apertures 320, 321 is also sub-resolution so that the apertures are formed in a litho-etch-litho-etch multiple patterning technique.

Figure 19:
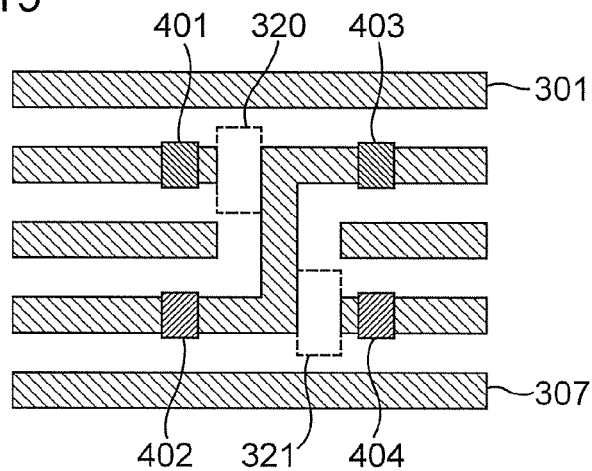
FIG. 19 depicts a division of features used to form the pattern of FIG. 17 between multiple exposure steps according to an embodiment of the invention.

FIG. 19 shows all of the exposure features required to create the pattern of FIG. 17, including the trim mask apertures 320 and 321. In the pattern, relative positioning of the vias 401, 402, 403, 404 and interconnects 302, 304, 305 formed by trimming the sacrificial feature 310 is critical. Hence the present invention can improve device formation by arranging that vias 401 and 403 are formed in one exposure and vias 402 and 404 are formed in another. Also trim-mask aperture 320 and any other features used to form interconnects 302 are formed in one exposure whilst trim mask aperture 321 is formed in another. As in the first embodiment, features used to form device features in a first layer that contact a device feature in a second associated layer are assigned to the same exposure of a multiple exposure process used to form the first layer.

Figure 20:
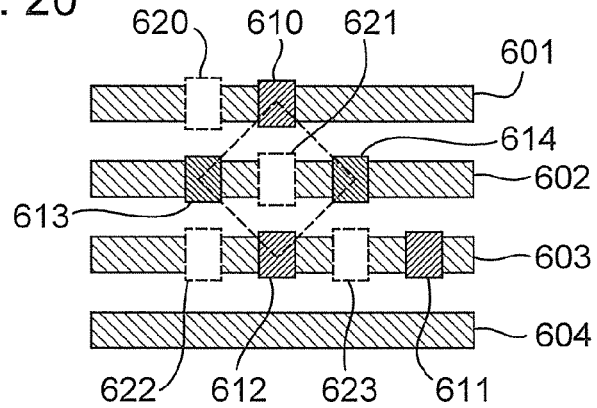
FIG. 20 depicts a division of features to be used to form a device pattern according to an embodiment of the invention.

FIG. 20 illustrates part of a device pattern in which features are assigned to exposures of a multiple exposure process according to an embodiment of the invention. This pattern comprises four parallel metal interconnects 601, 602, 603, 604 in a first layer which are to be trimmed by an etch process through apertures 620, 621, 622, 623 in a trim mask. The trim mask apertures 620, 621, 622, 623 are arranged in a so-called staircase pattern. There are five vias 610-614 in a second layer, of which four vias 610, 612, 613, 614 are arranged in a diamond pattern interleaved with the staircase pattern of the trim mask apertures. Trim mask apertures 622, 623 will be used to trim interconnect 603 into three parts and vias 611, 612 contact parts of the trimmed interconnect. Thus, according to the method of the invention, trim mask apertures 622 are assigned to the same exposure of a multiple exposure process used to form the trim mask. Similarly, vias 611, 612 are formed using the same exposure of a multiple exposure process used to define the via layer. Trim mask aperture 621, which trims the adjacent interconnect 602 is formed in a different exposure than trim mask apertures 622, 623. Vias 613, 614 which also contact interconnect 602, are defined in the same exposure of the multiple exposure process, e.g. litho-etch-litho-etch, and to define the vias as each other, but a different exposure than vias 622, 623. The same advantages accrues as in the first embodiment.

An embodiment of the invention in which the splitting process is applied to three layers of a device is described with reference to FIGS. 21 and 22. In this example, the pattern comprises two layers of metal interconnects, referred to for convenience as M1 and M2, and a layer of vias which make interlayer connections between the metal interconnect layers.

Figure 21:
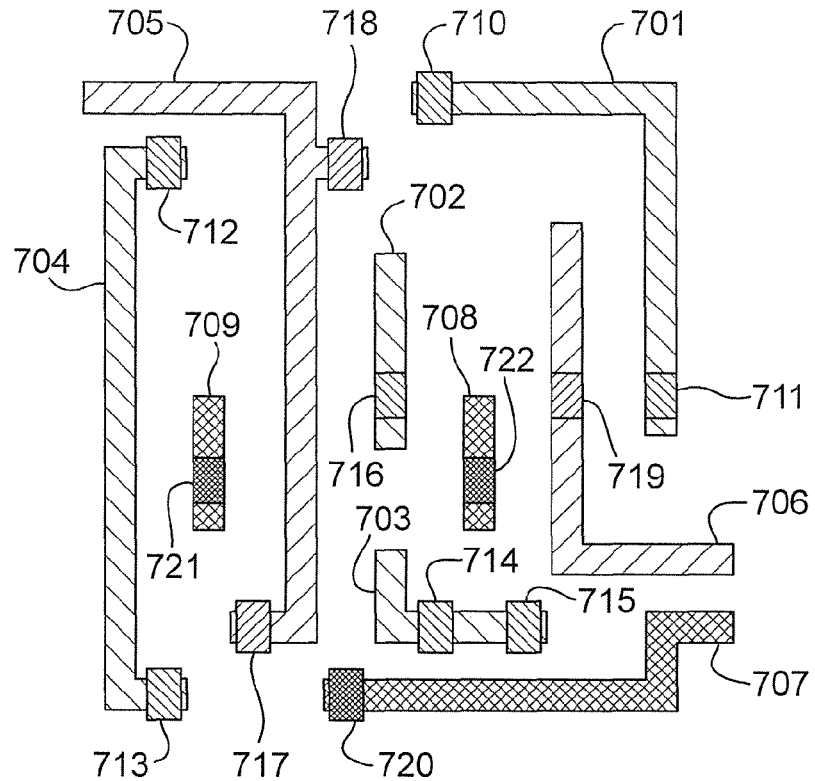
FIG. 21 depicts a pattern with features divided between multiple exposure steps according to an embodiment of the invention.

FIG. 21 depicts one of the metal interconnect layers, e.g. M1, and the via layer. Features 701 to 709 depict features of the metal interconnect layer whilst features 710 to 722 depict vias.

The metal interconnect features 701 to 709 are divided into three sets according to a predetermined rule, e.g. based on geometry and minimum feature spacing. The predetermined rule can include sub-rules that divide features into sub-features. In this example, set 1 includes features 701, 702, 703 and 704. Set 2 includes features 705 and 706. Set 3 includes features 707, 708 and 709. The vias 710 to 722 are assigned to sets according to a second predetermined rule that takes account of the division of features according to the first predetermined rule. In this example, vias that contact features of a given set of the first layer interconnects are assigned to the same corresponding set. In this example, it can be seen that vias 710, 711, 712, 713, 714, 715 and 716, all of which contact interconnect features 701, 702, 703 and 704, which are assigned to set 2, are assigned to set 4. Similarly, vias 717, 718 and 719, which contact interconnects 705 and 706 of set 2, are assigned to set 5. Finally, vias 720, 721 and 722, which contact interconnects 707, 708 and 709 of set 3, are assigned to set 6. In other words features of set 1 (layer 1) associate with set 4 (layer 2), set 2 (layer 1) associated with set 5 (layer 2) and set 3 (layer 1) associate with set 6 (layer 2).

Figure 22:
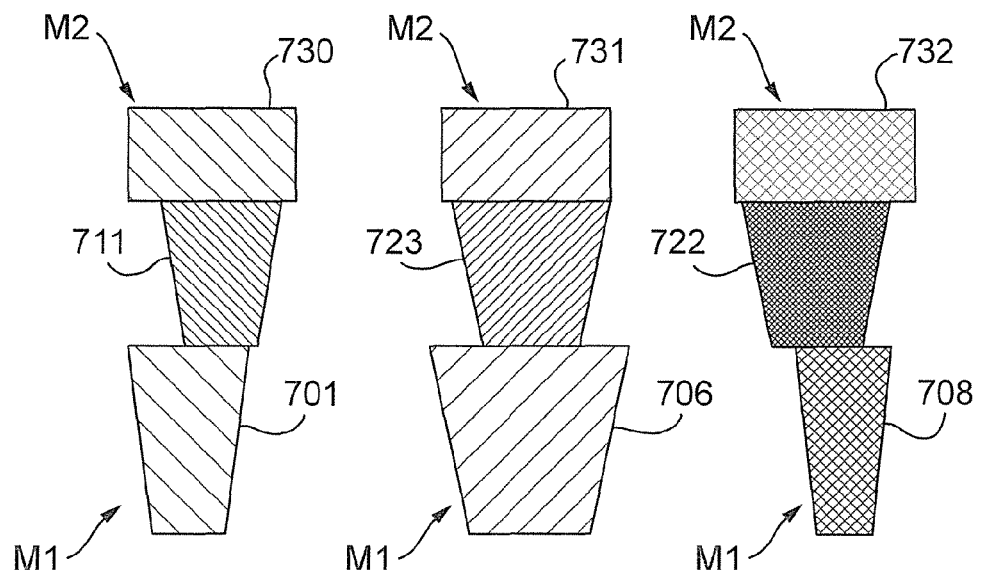
FIG. 22 depicts a cross-sectional view of some features of the pattern of FIG. 21.

FIG. 22 illustrates in cross-section perpendicular to the surface of the substrate on which the device is formed how a second layer of interconnects 730, 731 and 732 is connected to the vias. In this drawing for simplicity only three features from each in the second interconnect layer, M2, the interconnects are assigned to three sets, set 7, set 8 and set 9, whereas the interconnect of set 7 contact the vias of set 4, the interconnect of set 8 contact the vias of set 5 and the interconnect of set 6. With features of the three different layers that contact each other being assigned to sub-patterns in this way, the overall overlay error between features in each stack is reduced to the single layer overlay case and device yield thereby increased. In other words the following associations are made:

set 1 (layer 1)-set 2 (layer 2)-set 7 (layer 3);
set 2 (layer 1)-set 5 (layer 2)-set 8 (layer 3); and
set 3 (layer 1)-set 6 (layer 2)-set 9 (layer 3).

It will be appreciated that in an embodiment of the invention the assigning of features to different sets corresponding to different sub-patterns, can be iterative so that if, for example, assignment of the second interconnect layer based on the assignments of the first interconnect and via layers results in a sub-pattern that is difficult or impossible to image, assignment of the previously assigned layers can be re-visited. It is also possible to split features in the interconnect layers in order to arrive at a printable sub-pattern.

The method of the invention can also be extended to multiple patterning processes in which more than three patterning steps are used for each layer. Although particularly applicable to interconnect and vias, splitting layers into three or more sub-patterns can also be applied to other layer combinations. The layers that are split need not be consecutively formed, for example one or more additional device layers may be formed above the first interconnect layer with the vias being etched through those layers to contact the first metal interconnect layers.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid. The invention can also be applied to non-immersion lithography apparatus.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The invention may further be described using the following clauses:

1. A method of preparing an exposure pattern for a device manufacturing method using a lithographic apparatus, the method comprising:

receiving first data representing a first pattern to be used to define a first layer of a device using the lithographic apparatus;

receiving second data representing a second pattern to be used to define a second layer of a device using the lithographic apparatus, the second layer being associated with the first layer;

first assigning features of the first pattern to a first set and a second set according to a first rule;

second assigning features of the second pattern to a third set and a fourth set according to a second rule, wherein the second rule takes account of the results of the first assigning.

2. A method according to clause 1, wherein the second rule is that a plurality of features of the second pattern that define device features of the second layer that contact one device feature defined by the first pattern are assigned to the same one of the third and fourth sets.

3. A method according to clause 1 or 2, wherein the second rule is that all features of the second pattern that define device features of the second layer that contact device features of the first layer defined by the first set of features are assigned to the third set and all features of the second pattern that define device features of the second layer that contact device features of the first layer defined by the second set of features are assigned to the fourth set.

4. A method according to clause 1, 2 or 3 wherein the first rule includes a condition based on at least one of the group consisting of: edge-to-edge distance; corner-to-corner distance; center-to-center distance; and pitch.

5. A method according to clause 1, 2, 3 or 4 further comprising, if the second assigning assigns two features to the same one of the third and fourth sets that are closer together than a threshold set by a third rule, taking remedial action.

6. A method according to clause 5, wherein the remedial action is selected from the group consisting of: adjusting the assignment of features to the first and second sets; adding or adjusting optical proximity correction to a feature; and manual intervention.

7. A method according to clause 5 or 6, wherein the third rule includes a condition based on at least one of the group consisting of: edge-to-edge distance; corner-to-corner distance; center-to-center distance; and pitch.

8. A method according to any one of the preceding clauses wherein:

first assigning further comprises assigning features of the first pattern to a fifth set; and second assigning further comprises assigning features of the second pattern to a sixth set; and further comprising:

receiving third data requesting a third pattern to be used to define a third layer of the device using the lithography apparatus; and third assigning features of the third pattern to a seventh set, an eighth set and a ninth set according to a third rule, wherein the third rule takes account of the results of the first and/or second assigning.

9. A method according to clause 8 wherein the second and third rules are that:

features of the first set (first layer), fourth set (second layer) and seventh set (third layer) contact each other;

features of the second set (first layer), fifth set (second layer) and eighth set (third layer) contact each other;

features of the fifth set (first layer), sixth set (second layer) and ninth set (third layer) contact each other.

10. A method according to any one of the preceding clauses wherein at least one of the first pattern and the second pattern defines a trim mask.

11. A method according to any one of clauses 1 to 10, wherein the method is computer implemented.

12. A method of forming a mask set, the method comprising:

preparing an exposure pattern according to the method of any one of clauses 1 to 11;

forming a set of masks, the set of masks including a plurality of masks, each mask embodying a respective one of sets of features.

13. A device manufacturing method using a lithographic apparatus, the method comprising the steps of:

forming a set of masks according to the method of clause 12;

projecting a beam patterned by one of the plurality of masks onto a substrate to expose it to the respective pattern;

processing the substrate to fix the pattern exposed thereon; and repeating the projecting and processing steps using each other one of the plurality of masks.

14. A method according to clause 13, further comprising performing an alignment process to align the exposure of the third mask directly to the exposure of the first mask.

15. A method according to clause 13 or 14, further comprising performing an alignment process to align the exposure of the fourth mask directly to the exposure of the second mask.

16. A method according to clause 13, further comprising performing an alignment process to align the exposure of the first mask and the second mask to a same reference, or to align the exposure of the first mask, the second mask, the third mask and the fourth masks to the same reference.

17. A method according to clause 13, 14, 15 or 16 wherein processing the substrate includes a process step selected from the group consisting of etching and growing a spacer layer.

18. A computer program for programming an exposure pattern for a device manufacturing method using a lithographic apparatus, the program comprising code that, when executed by a computer system, instructs the computer system to:

receive first data representing a first pattern to be used to define a first layer of a device using the lithographic apparatus;

receive second data representing a second pattern to be used to define a second layer of a device using the lithographic apparatus, the second layer being associated with the first layer;

first assign features of the first pattern to a first set and a second set according to a first rule;

second assign features of the second pattern to a third set and a fourth set according to a second rule, wherein the second rule takes account of the results of the first assigning.

The descriptions above are intended to be illustrative, not limiting. Thus, it will be apparent to one skilled in the art that modifications may be made to the invention as described without departing from the scope of the claims set out below.

The invention claimed is:

1. A method of preparing an exposure pattern for a device manufacturing method using a lithographic apparatus, the method comprising:

receiving first data representing a first pattern to be used to define a first layer of a device using the lithographic apparatus;

receiving second data representing a second pattern to be used to define a second layer of a device using the lithographic apparatus, the second layer being associated with the first layer;

first assigning features of the first pattern to a first set and a second set according to a first rule;

second assigning features of the second pattern to a third set and a fourth set according to a second rule, wherein the second rule takes account of the results of the first assigning.

2. A method according to claim 1, wherein the second rule is that a plurality of features of the second pattern that define device features of the second layer that contact one device feature defined by the first pattern are assigned to the same one of the third and fourth sets.

3. A method according to claim 1, wherein the second rule is that all features of the second pattern that define device features of the second layer that contact device features of the first layer defined by the first set of features are assigned to the third set and all features of the second pattern that define device features of the second layer that contact device features of the first layer defined by the second set of features are assigned to the fourth set.

4. A method according to claim 1, wherein the first rule includes a condition based on at least one of the group consisting of: edge-to-edge distance; corner-to-corner distance; center-to-center distance; and pitch.

5. A method according to claim 1, further comprising, if the second assigning assigns two features to the same one of the third and fourth sets that are closer together than a threshold set by a third rule, taking remedial action.

6. A method according to claim 5, wherein the remedial action is selected from the group consisting of: adjusting the assignment of features to the first and second sets; adding or adjusting optical proximity correction to a feature; and manual intervention.

7. A method according to claim 5, wherein the third rule includes a condition based on at least one of the group consisting of: edge-to-edge distance; corner-to-corner distance; center-to-center distance; and pitch.

8. A method according to claim 6, wherein the third rule includes a condition based on at least one of the group consisting of: edge-to-edge distance; corner-to-corner distance; center-to-center distance; and pitch.

9. A method according to claim 1, wherein:

first assigning further comprises assigning features of the first pattern to a fifth set; and second assigning further comprises assigning features of the second pattern to a sixth set; and further comprising:

receiving third data requesting a third pattern to be used to define a third layer of the device using the lithography apparatus; and third assigning features of the third pattern to a seventh set, an eighth set and a ninth set according to a third rule, wherein the third rule takes account of the results of the first and/or second assigning.

10. A method according to claim 9 wherein the second and third rules are that:

features of the first set (first layer), fourth set (second layer) and seventh set (third layer) contact each other;

features of the second set (first layer), fifth set (second layer) and eighth set (third layer) contact each other;

features of the fifth set (first layer), sixth set (second layer) and ninth set (third layer) contact each other.

11. A method according to claim 1, wherein at least one of the first pattern and the second pattern defines a trim mask.

12. A method according to claim 1, wherein the method is computer implemented.

13. A method of forming a mask set, the method comprising:

preparing an exposure pattern according to the method of claim 1;

forming a set of masks, the set of masks including a plurality of masks, each mask embodying a respective one of sets of features.

14. A device manufacturing method using a lithographic apparatus, the method comprising the steps of:
  forming a set of masks according to the method of claim 13;
  projecting a beam patterned by one of the plurality of masks onto a substrate to expose it to the respective pattern;
  processing the substrate to fix the pattern exposed thereon; and
  repeating the projecting and processing steps using each other one of the plurality of masks.

15. A method according to claim 14, further comprising performing an alignment process to align the exposure of the third mask directly to the exposure of the first mask.

16. A method according to claim 14, further comprising performing an alignment process to align the exposure of the fourth mask directly to the exposure of the second mask.

17. A method according to claim 14, further comprising performing an alignment process to align the exposure of the first mask and the second mask to a same reference, or to align the exposure of the first mask, the second mask, the third mask and the fourth masks to the same reference.

18. A method according to claim 14, wherein processing the substrate includes a process step selected from the group consisting of etching and growing a spacer layer.

19. A computer program for programming an exposure pattern for a device manufacturing method using a lithographic apparatus, the program comprising code that, when executed by a computer system, instructs the computer system to:
  receive first data representing a first pattern to be used to define a first layer of a device using the lithographic apparatus;
  receive second data representing a second pattern to be used to define a second layer of a device using the lithographic apparatus, the second layer being associated with the first layer;
  first assign features of the first pattern to a first set and a second set according to a first rule;
  second assign features of the second pattern to a third set and a fourth set according to a second rule, wherein the second rule takes account of the results of the first assigning.

* * * * *